(12) United States Patent
Sato

(10) Patent No.: US 9,603,204 B2
(45) Date of Patent: Mar. 21, 2017

(54) DISPLAY DEVICE

(71) Applicant: Japan Display Inc., Tokyo (JP)

(72) Inventor: Toshihiro Sato, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 14/606,658

(22) Filed: Jan. 27, 2015

(65) Prior Publication Data

US 2015/0223297 A1    Aug. 6, 2015

(30) Foreign Application Priority Data

Feb. 4, 2014  (JP) ................. 2014-019250

(51) Int. Cl.
| | |
|---|---|
| *G02B 5/23* | (2006.01) |
| *H05B 33/04* | (2006.01) |
| *H05B 33/12* | (2006.01) |
| *G06F 3/041* | (2006.01) |
| *G02B 5/20* | (2006.01) |

(52) U.S. Cl.
CPC .......... *H05B 33/04* (2013.01); *G06F 3/0412* (2013.01); *H05B 33/12* (2013.01); *G02B 5/201* (2013.01); *G06F 2203/04103* (2013.01); *G06F 2203/04107* (2013.01)

(58) Field of Classification Search
CPC ................................... G02B 5/201
USPC ................................. 313/498–512
See application file for complete search history.

(56) References Cited

U.S. PATENT DOCUMENTS

| | | | |
|---|---|---|---|
| 2005/0041134 A1* | 2/2005 | Takayama | G02B 3/0075 348/340 |
| 2005/0248270 A1* | 11/2005 | Ghosh et al. | 313/512 |
| 2006/0008930 A1* | 1/2006 | Toyoda | G02B 5/201 438/22 |
| 2007/0002192 A1* | 1/2007 | Nishino et al. | 349/12 |
| 2007/0003743 A1* | 1/2007 | Asano et al. | 428/201 |
| 2007/0170839 A1 | 7/2007 | Choi et al. | |

(Continued)

FOREIGN PATENT DOCUMENTS

| | | |
|---|---|---|
| CN | 101587255 A | 11/2009 |
| JP | 2007-194184 A | 8/2007 |

(Continued)

OTHER PUBLICATIONS

Office Action issued on Mar. 4, 2016, for the corresponding Taiwanese Patent Application No. 104100432.

(Continued)

*Primary Examiner* — Nimeshkumar Patel
*Assistant Examiner* — Christopher Raabe
(74) *Attorney, Agent, or Firm* — Typha IP LLC

(57) ABSTRACT

A display device includes a first substrate including a display region arranged with a plurality of pixels arranged with a light emitting element, a second substrate including a light shielding layer having an aperture part corresponding to the pixel and a color filter being arranged in at least the aperture part and including a pigment layer, a seal component including glass, the seal component bonding the first substrate and second substrate, the display region and color filter facing each other, and being arranged on the exterior side of the color filter, and an inorganic insulation layer covering at least an upper surface and end part of the color filter.

20 Claims, 12 Drawing Sheets

(56) References Cited

U.S. PATENT DOCUMENTS

| | | | | |
|---|---|---|---|---|
| 2009/0231523 A1* | 9/2009 | Matsumoto | ............ | G02B 5/223 |
| | | | | 349/110 |
| 2012/0273804 A1* | 11/2012 | Hatano | ............................ | 257/79 |
| 2012/0326951 A1* | 12/2012 | Yamazaki et al. | ............... | 345/76 |
| 2013/0300284 A1* | 11/2013 | Nishido | ........................ | 313/511 |
| 2014/0231770 A1* | 8/2014 | Inoue et al. | ..................... | 257/40 |

FOREIGN PATENT DOCUMENTS

| | | |
|---|---|---|
| JP | 2009-151945 A | 7/2009 |
| JP | 2013-069480 A | 4/2013 |
| JP | 2013-218010 A | 10/2013 |

OTHER PUBLICATIONS

Korean Office Action mailed on Apr. 25, 2016 for the corresponding Korean Application No. 10-2015-0008467.
Korean Office Action mailed on Sep. 5, 2016 for corresponding Korean Application No. 10-2015-0008467 with partial translation.
Chinese Office Action mailed on Dec. 23, 2016 for corresponding Chinese Application No. 201510029030.X with partial translation.

\* cited by examiner

DISPLAY DEVICE

CROSS REFERENCE TO RELATED APPLICATIONS

This application is based upon and claims the benefit of priority from the prior Japanese Patent Application No. 2014-019250, filed on Feb. 4, 2014, the entire contents of which are incorporated herein by reference.

FIELD

The present invention is related to a display device and a method of manufacturing the display device. In particular, the present invention is related to a display device in which a substrate formed with a light emitting element and an opposing substrate are sealed with a glass frit and a method of manufacturing the display device.

BACKGROUND

In recent years, in a light emitting display device for mobile purposes, there is a strong demand for high resolution and low power consumption. Display devices which use a liquid crystal display device (LCD) or organic light-emitting diode (OLED) such an organic EL display device or electronic paper etc are being adopted.

Among these, because an organic EL display device does not require a back light or polarizing plate which were necessary in liquid crystal devices, it is possible to form a display device just with a thin film. In addition, it is possible to realize a display device capable of bending (flexible). Furthermore, since these display devices do not use a glass substrate, they are display devices which are light and difficult to break. For these reasons, organic EL display devices are attracting a lot of attention. In addition, in an organic EL display device of a medium/small size, high definition and a narrow frame of a display part is required.

In order to achieve an organic EL display device with high definition, a device structure mounted with RGB pixels are being developed by combining white organic EL elements with color filters (CF) to achieve a "white+CF structure". In addition, in order to achieve a narrow frame, it is necessary to reduce the area of the periphery region of the display device. In order to achieve this, it is necessary to narrow the width of a seal component arranged in the periphery region of a pixel and reduce the distance between the seal component and display region.

Here, a light emitting element such as an organic EL element arranged in each pixel of an organic EL display device is known to degrade when exposed to oxygen or water which decreases light emitting efficiency. In order to solve this problem for example, a display device is disclosed in the Japanese Laid Open Patent 2007-194184 in which a sealing structure with high air sealing properties is disclosed by bonding a substrate arranged with a light emitting element and an opposing substrate which faces the substrate using a glass frit.

However, in the "white+CF structure" described above, especially in the case where a color filter is arranged between two bonded substrates, the light element sometimes degrades due to degassing or dehydration from the color filter. In addition, when narrowing of the frame of the display device increases, the distance between the glass frit which fuses the two substrates and the display region arranged with the pixels is reduced. As a result, when fusing by local heating the glass frit using laser radiation etc, a part of the laser is irradiated on a pixel of the display region which causes degradation of the light emitting element. In addition, heat generated by local heating due to laser irradiation is transmitted to a light emitting element of a pixel arranged in the display region which sometimes leads to degradation of the light emitting element.

SUMMARY

A display device according to one embodiment of the present invention includes a first substrate including a display region arranged with a plurality of pixels having a light emitting element, a second substrate including a light shielding layer having an aperture part corresponding to the pixel and a color filter being arranged in at least the aperture part and including a pigment layer, a seal component including glass, the seal component bonding the first substrate and second substrate so that the display region and color filter faces each other, and being arranged on the exterior side of the color filter, and an inorganic insulation layer covering at least an upper surface and end part of the color filter.

In addition, in another aspect the light emitting element may be exposed in a space part enclosed by the first substrate, the second substrate and seal component.

In addition, in another aspect the seal component may contact the inorganic insulation layer.

In addition, in another aspect a gas with a dew point of $-70°$ C. or less may be included in the space part.

In addition, in another aspect a gas with an oxygen concentration of 1 ppm or less may be included in the space part.

A display device according to one embodiment of the present invention includes a first substrate including a display region arranged with a plurality of pixels having a light emitting element, a second substrate including a light shielding layer having an aperture part corresponding to the pixel and a slit in a periphery region located in a periphery of the display region, and a seal component including glass, the seal component bonding the first substrate and second substrate so that the display region and color filter faces each other.

In addition, in another aspect the slit may be continuously arranged so as to enclose the display region.

In addition, in another aspect the second substrate may include a color filter having a pigment layer and arranged in at least an aperture part of the light shielding layer, and an inorganic insulation layer covering at least an upper surface and end part of the color filter.

In addition, in another aspect the light emitting element may be exposed in a space part enclosed by the first substrate, the second substrate and the seal component.

In addition, in another aspect the seal component may contact the inorganic insulation layer.

In addition, in another aspect a gas with a dew point of $-70°$ C. or less may be included in the space part.

In addition, in another aspect a gas with an oxygen concentration of 1 ppm or less may be included in the space part.

A display device according to one embodiment of the present invention includes a first substrate including a display region arranged with a plurality of pixels having a light emitting element, a second substrate including a first light shielding layer and a second light shield layer, the first light shielding layer having an aperture part corresponding to the pixel, the second light shielding layer being arranged in a periphery region located in a periphery of the display region in a surface opposite a surface arranged with the first light shielding layer, and a seal component including glass, the seal component bonding the first substrate and second substrate so that the display region and color filter faces each other.

In addition, in another aspect the second light shielding layer may be continuously arranged so as to enclose the display region.

In addition, in another aspect a transparent conductive layer may be included arranged in the display region in a surface arranged with second light shielding layer.

In addition, in another aspect the transparent conductive layer may be a wiring of a touch sensor.

A method of manufacturing a display device according to one embodiment of the present invention includes forming a light emitting element in a display region of a first substrate arranged with a plurality of pixels, forming a light shielding layer having an aperture part corresponding to a pixel in a second substrate and forming a color filter being arranged in at least the aperture part and including a pigment layer, forming an inorganic insulation layer to cover at least an upper surface and end part of the color filter, bonding the first substrate and the second substrate via a seal member, the display region and color filter facing each other, and irradiating the seal member with a laser via a mask including an aperture part corresponding to the seal member so as to fuse the seal member.

A method of manufacturing a display device according to one embodiment of the present invention includes forming a light emitting element in a display region of a first substrate arranged with a plurality of pixels, forming a light shielding layer having an aperture part corresponding to a pixel in a second substrate and forming a color filter being arranged in at least the aperture part and including a pigment layer, forming an inorganic insulation layer to cover at least an upper surface and end part of the color filter, bonding the first substrate and the second substrate via a seal member, the display region and color filter facing each other, and locally irradiating a region corresponding to the seal member with a laser so as to fuse the seal member In addition, in another aspect the first substrate and second substrate may be bonded so that the light emitting element is exposed in a space part enclosed by the first substrate, the second substrate and the seal member.

In addition, in another aspect the bonding process may be performed under an atmosphere with a dew point of −70° C. or less and more preferably −70° C.

In addition, in another aspect the bonding process may be performed under an atmosphere with an oxygen concentration of 1 ppm or less and more preferably 0.55 pm or less.

DESCRIPTION OF EMBODIMENTS

Figure 1:
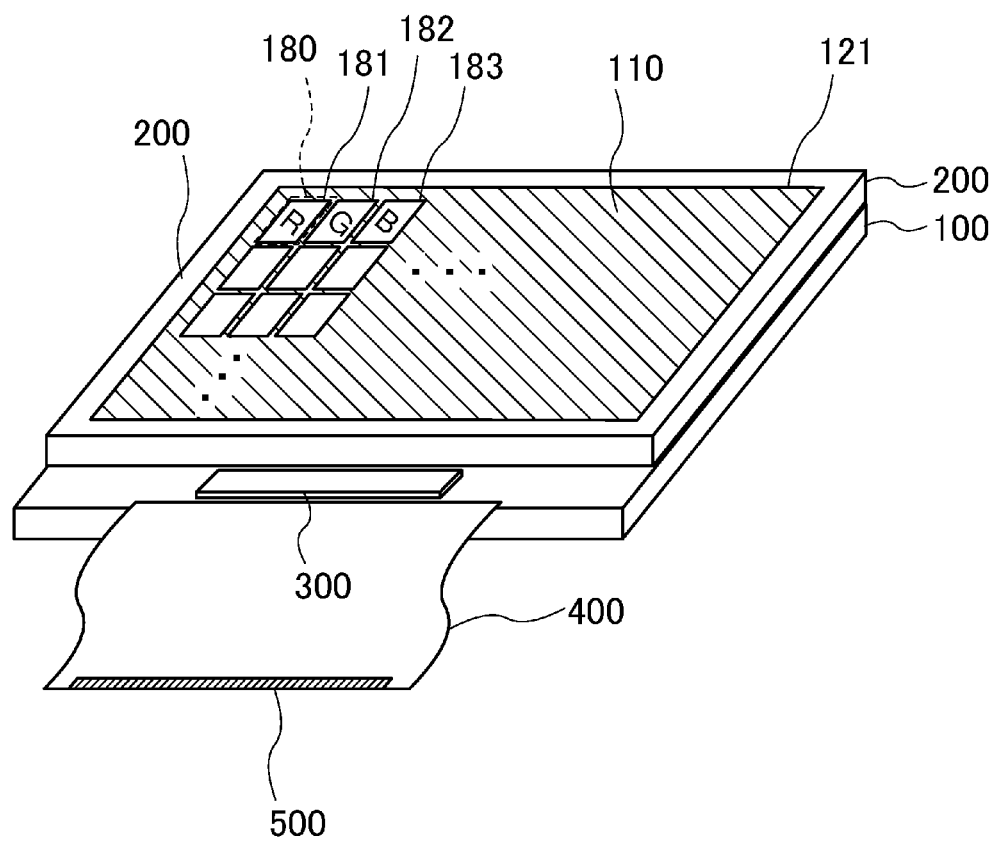
FIG. 1 is a diagram showing a perspective view of a display device in embodiment one of the present invention.
Figure 2:
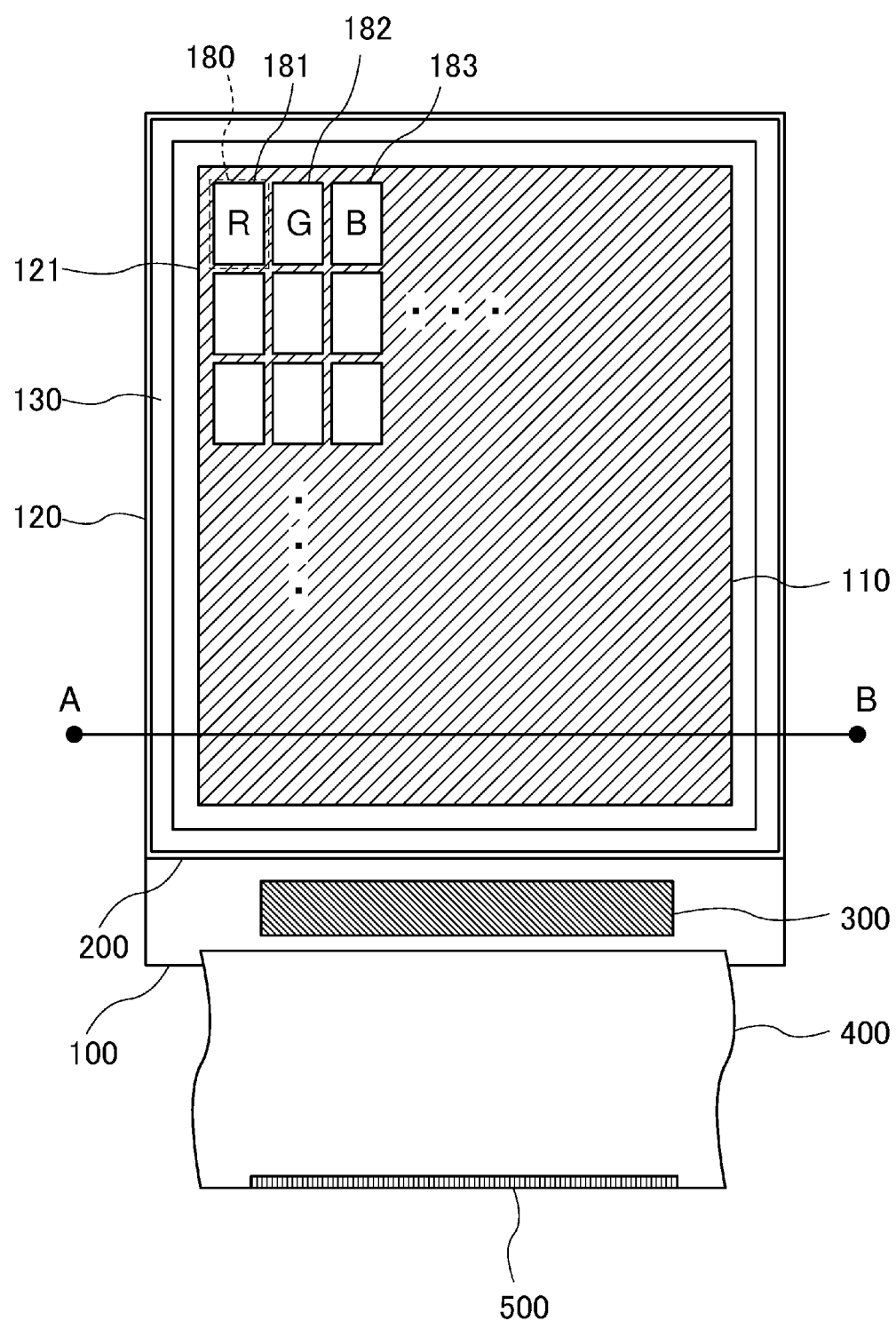
FIG. 2 is a diagram showing a planar view of a display device in embodiment one of the present invention.

Each embodiment of the present invention is explained below while referring to the drawings. Furthermore, the disclosure is merely one example and various modifications which conform with the premise of the invention and which could be easily conceived of by person ordinarily skilled in the art are included within the scope of the present invention. In addition, in order to further clarify explanation, the drawings may be expressed schematically with respect to the width, thickness and shape of each part compared to actual appearance and are only examples and do not limit the interpretation of the present invention. In addition, in the specification and each drawing the same reference symbols are attached to the same elements that have previously been described or already exist in previous drawings Embodiment One The structure of a display device related to embodiment one of the present invention is explained using FIG. 1 to FIG. 4. FIG. 1 is a diagram showing a perspective view of the display device in embodiment one of the present invention. FIG. 2 is a diagram showing a planar view of a display device in embodiment one of the present invention. In embodiment one, a display device with a "white+CF structure" which is useful for high definition is explained.

Although a "white+CF structure" is useful for realizing a high definition display device, when the distance between a light emitting element and color filter is separated, a problem of mixed colors is produced due to light entering from the light emitting element of an adjacent pixel. Therefore, in a "white+CF structure", it is necessary to bring the light emitting element and color filter as close as possible together. As one example of this, a structure is exemplified in which a color filter is arranged between a substrate arranged with a light emitting element and an opposing substrate.

In addition, because it is possible to obtaining a very high level of air tightness by arranging a glass frit in a seal member, it is possible to suppress water from entering from the exterior. However, as described above, in a structure in which a color filter is arranged between substrates, a problem sometimes occurs in which a light emitting element degrades due to degassing or dehydration from an organic material such as a color filter. In embodiment one, a structure which solves the problem described above is explained.

As shown in FIG. 1 and FIG. 2, the display device in embodiment one includes a substrate 100 including a display region 110 arranged with a plurality of pixels 180 arranged with a light emitting element, an opposing substrate 200 including a light shielding layer 121 having an aperture part corresponding to a pixel 180 and color filters 181 to 183 being arranged in the aperture part of the light shielding layer 121, a driver IC 300 arranged in a region exposed by the substrate 100, and a FPC 400 (flexible printed circuit). The substrate 100 is divided into a display region 110 and a periphery region 120 arranged in the periphery of the display region 110. The pixels 180 are arranged in a matrix in the display region 110 each of the plurality of pixels 180 is arranged with a light emitting element. The light shielding layer 121 including an aperture part corresponding to each of the plurality of pixels 180 is arranged in the opposing substrate 200, and color filters 181 to 183 including pigment layer may be arranged in at least the aperture part of the light shielding layer 121. Here, a region which is exposed by the substrate 100 and in which the driver IC 300 and FPC 400 are connected may be included in the periphery region 120. A terminal part 500 which is connected to a controller circuit which controls a drive circuit is arranged in the FPC 400.

As is shown in FIG. 2, the glass frit 130 which functions as a seal member for bonding the substrate 100 and opposing substrate 200 is arranged in a region corresponding to the periphery region 120. The glass frit 130 is a glass material with a melting point of 300° C. or more and 700° C. or less. In addition, the glass frit 130 may have various forms such as a powder shape or paste shape. The glass frit 130 is arranged continuously so as to enclose the display region 110 which includes the color filters 181 to 183 in an exterior periphery part of the periphery region 120. That is, the glass frit 130 is arranged on the exterior side of the color filters 181 to 181. In addition, in a planar view of the display device, an offset is arranged between the display region 110 and the glass frit 130. Here, although an offset is arrange between the exterior periphery end part of the periphery region 120 and glass frit 130, the present invention is not limited to this structure. The glass frit may also be arranged up to the exterior periphery end part of the periphery region 120. Here, the light shielding layer 121 is arranged at least within the display region 110 and on the exterior edge part of the display region 110.

Figure 3:
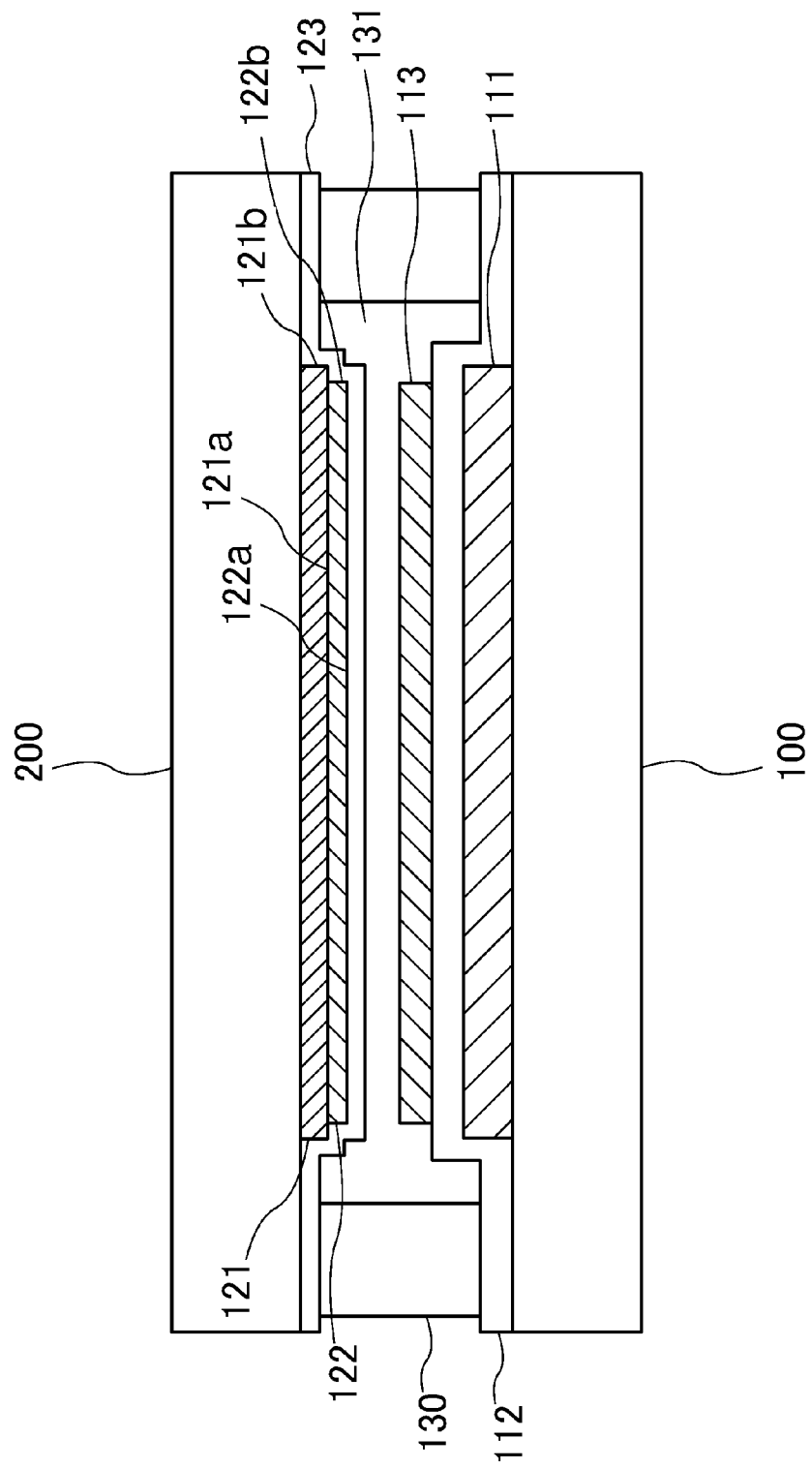
FIG. 3 is a diagram showing a cross-sectional view of the line A-B in a display device in embodiment one of the present invention.

FIG. 3 is a diagram showing the A-B cross-sectional view of the display device in embodiment one. Here, in FIG. 3, the surface of the substrate 100 faces in the direction of the opposing substrate 200 and the surface of the opposing substrate 200 faces the direction of the substrate 100. In the following explanation, when explaining the structural components arranged with respect to each of the substrate 100 and opposing substrate 200, the surface direction of each substrate is expressed as facing upwards.

In FIG. 3, a transistor layer 111 is arranged above the substrate 100, an interlayer insulation layer 112 is arranged above the transistor layer 111 and a light emitting element 113 is arranged above interlayer insulation layer 112. A pixel circuit transistor arranged in the display region 110 or periphery circuit transistor arranged in the periphery region 120 is included in the transistor layer 111. The light emitting element 113 is arranged in the display region 110 and includes a lower part electrode, a light emitting layer and upper part electrode. The lower part electrode is connected to the transistor layer 111 via a contact arranged in the interlayer insulation layer 112 and the upper part electrode is a common electrode with a plurality of light emitting elements 113. Here, because the display device in embodiment one is a "white color+CF structure", the light emitting element 113 is designed with a light emitting element structure in order to emit white light.

In addition, the light shielding layer 121 and color filter 122 are arranged above the opposing substrate 200. The light shielding layer 121 includes an upper surface 121*a* which faces the substrate 100 and an end part 121*b* and the color filter 122 includes and upper surface 122*a* which faces the substrate 100 and an end part 122*b*. In addition, an inorganic passivation layer 123 is arranged to cover 121*a*, 122*a*, 121*b* and 122*b*. Here, the light shielding layer 121 is arranged to overlap wiring etc in a region which defines each pixel, and the color filter 122 is arranged in a region corresponding to each light emitting element in the display region 110. The glass frit 130 is arranged in the periphery region 120 and a space part 131 sandwiched between the substrate 100 and opposing substrate 200 is sealed. Here, in embodiment one, a $N_2$ gas is filled into the sealed space part 131.

Here, although the glass frit 130 is arranged in contact with interlayer insulation layer 112 and inorganic passivation layer 123, the present invention is not limited to this structure. Another layer may be arranged between the glass frit 130 and the interlayer insulation layer 112 or between the glass frit 130 and the inorganic passivation layer 123. In addition, either or both the interlayer insulation layer 112 and inorganic passivation layer 123 do not have to be present and either or both the substrate 100 and opposing substrate 200 may be in contact with the glass frit 130. In addition, although the light shielding layer 121, color filter 122 and inorganic passivation layer 123 are stacked in this order above the opposing substrate 200, the present invention is not limited to this structure. The color filter 122, light shielding layer 121 and inorganic passivation layer 123 may be stacked in this order. In addition, the light shield layer 121 and color filter 122 may have different patterns and do not have to be stacked.

In addition, in FIG. 3, although the substrate 100 and transistor layer 111 are in contact, the transistor layer 111 and interlayer insulation layer 112 are in contact, the interlayer insulation layer 112 and light emitting element 113 are in contact, the opposing substrate 200 and light shielding layer 121 are in contact, the light shielding layer 121 and color filter 122 are in contact, and the color filter 122 and inorganic passivation layer 123 are in contact, the present invention is not limited to this structure, another layer may be inserted between each of these.

In addition, the light emitting element 113 is exposed in the space part 131 enclosed by the substrate 100, opposing substrate 200 and glass frit 130. That is, a protection layer for protecting the light emitting layer from water or impurities is not formed above the light emitting element 113 but the surface of the light emitting element 113 is exposed in the space part 131. For example, in the case where a light emitting element is formed from a lower part electrode, light emitting layer and upper part electrode (common electrode), a protection layer is not formed above the common electrode but a common electrode is exposed in the space part 131.

In the case where a passivation layer is formed above a light emitting element, a passivation layer is formed above wiring of a terminal part for mounting the driver IC300 or FPC400. In order to mount the driver IC300 or FPC400, it is necessary to remove the terminal part of the passivation layer. However, by adopting the structure in which a passivation layer is not arranged above a light emitting layer as described above, it is possible to remove not only the process for forming a passivation layer but also the process for removing a terminal part of the passivation layer.

An inactive gas such as nitrogen ($N_2$) etc may be filled into the space part 131. However, the present invention is not limited to this structure, a gas with containing a low amount of water or oxygen which degrades the light emitting element 113 may also be filled in the space part 131. For example, the gas included in the space part 131 is preferred to have a dew point of −70° C. or less. More preferably, a dew point of −90° C. or less. In addition, the gas included in the space part 131 is preferred to have an oxygen concentration of 1 ppm or less. More preferably an oxygen concentration of 0.5 ppm or less. In addition, the space part 131 may be reduced in pressure or increased in pressure. In either case, it is preferred that the contained amount of water or oxygen is small.

In addition, a structure in which the glass frit 130 contacts the interlayer insulation layer 112 on the substrate 100 side and contacts the inorganic passivation layer 123 on the opposing substrate 200 side may be adopted. The material of interlayer insulation layer 112 and the inorganic passivation layer 123 which contact the glass frit 130 may be the same. By using the same material above and below a contact part with the glass frit 130, it is possible to obtain a gap part 131 with high sealing properties with a good level of reliability. Furthermore, structure in which the interlayer insulation layer 113 and inorganic passivation layer 123 contact the glass frit 130 may be adopted in which the glass frit is vertically symmetrical as standard (mirror structure). This mirror structure is referred to as a structure in which the substrate 100, silicon nitride, silicon oxide, glass frit, silicon oxide, silicon nitride and opposing substrate 200 are arranged in this order from the substrate 100 in a cross sectional view in FIG. 3 for example. Using the mirror structure described above, it is possible to obtain good reliability with high sealing properties and because stretching and contraction are reduced on the side of the substrate 100 and opposing substrate 200 which is generated by heat in a fusion process caused by laser irradiation of a glass frit etc, it is possible to relieve internal stress.

Figure 4:
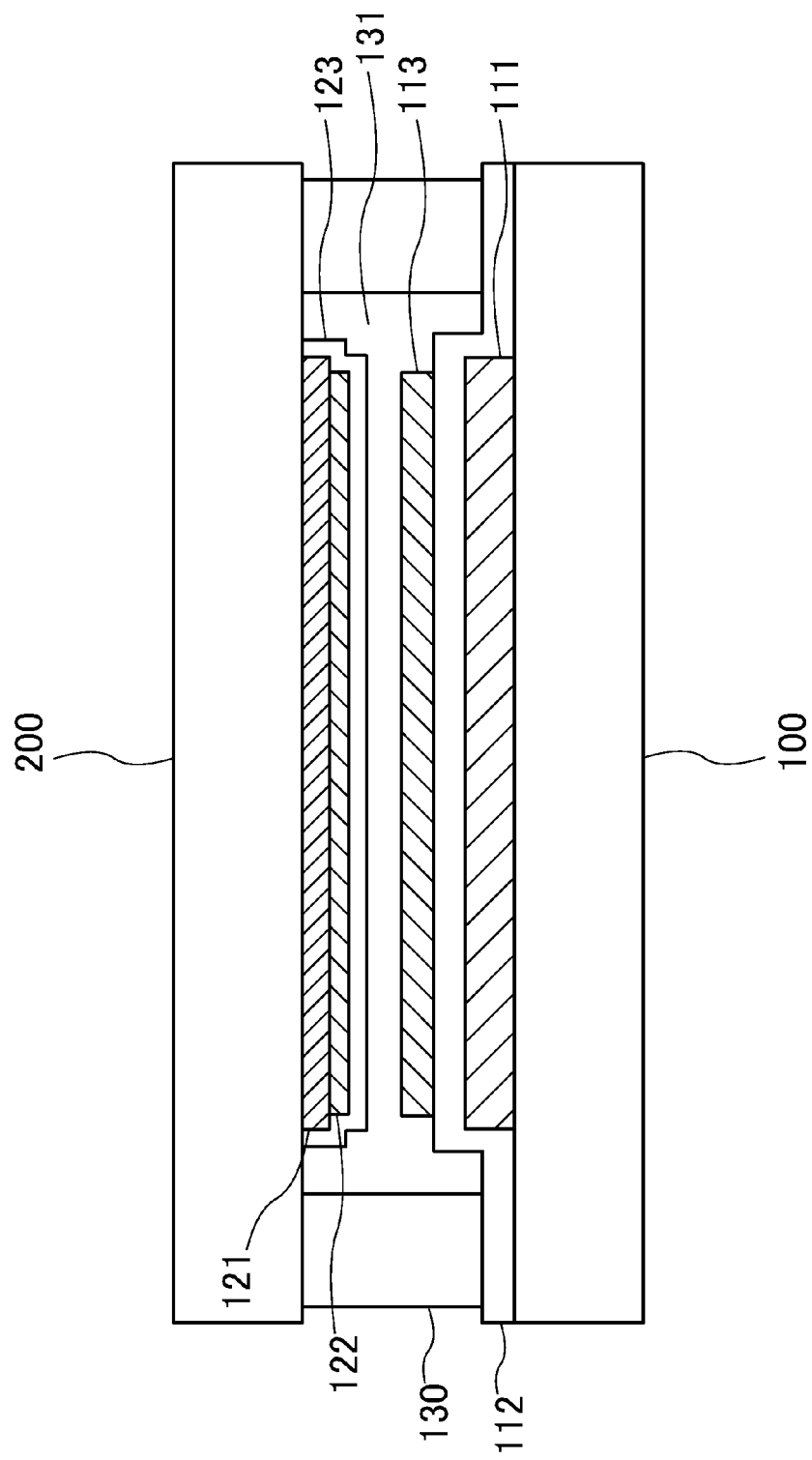
FIG. 4 is a diagram showing a cross-sectional view of the line A-B in a modified example of the display device in embodiment one of the present invention.

FIG. 4 is a diagram showing a cross-sectional view of the line A-B of the display device in a modified example of embodiment one of the present invention. The different point to FIG. 3 is that the organic passivation layer 123 does not exists in the region arranged with the glass frit 130 but the glass frit 130 and opposing substrate 200 are in contact. Even in the case of the structure in FIG. 4, the light shielding layer 121 and color filter 122 are covered by the inorganic passivation layer 123 and are not exposed in the space part 131 where the light shielding layer 121 and color filter 122 are sealed.

As described above, according to the display device in embodiment one of the present invention, in a display device where a color filter or light shielding layer is arranged between substrates and both substrates are bonded using a glass frit, it is possible to suppress degradation of a light emitting element caused by degassing or water from an organic material such as a color filter. In addition, because it is not necessary to form a passivation layer above a light emitting element, it is possible to omit a process for etching a passivation layer in order to expose a terminal part after bonding the substrate 100 and opposing substrate 200.

Embodiment Two

Figure 5:
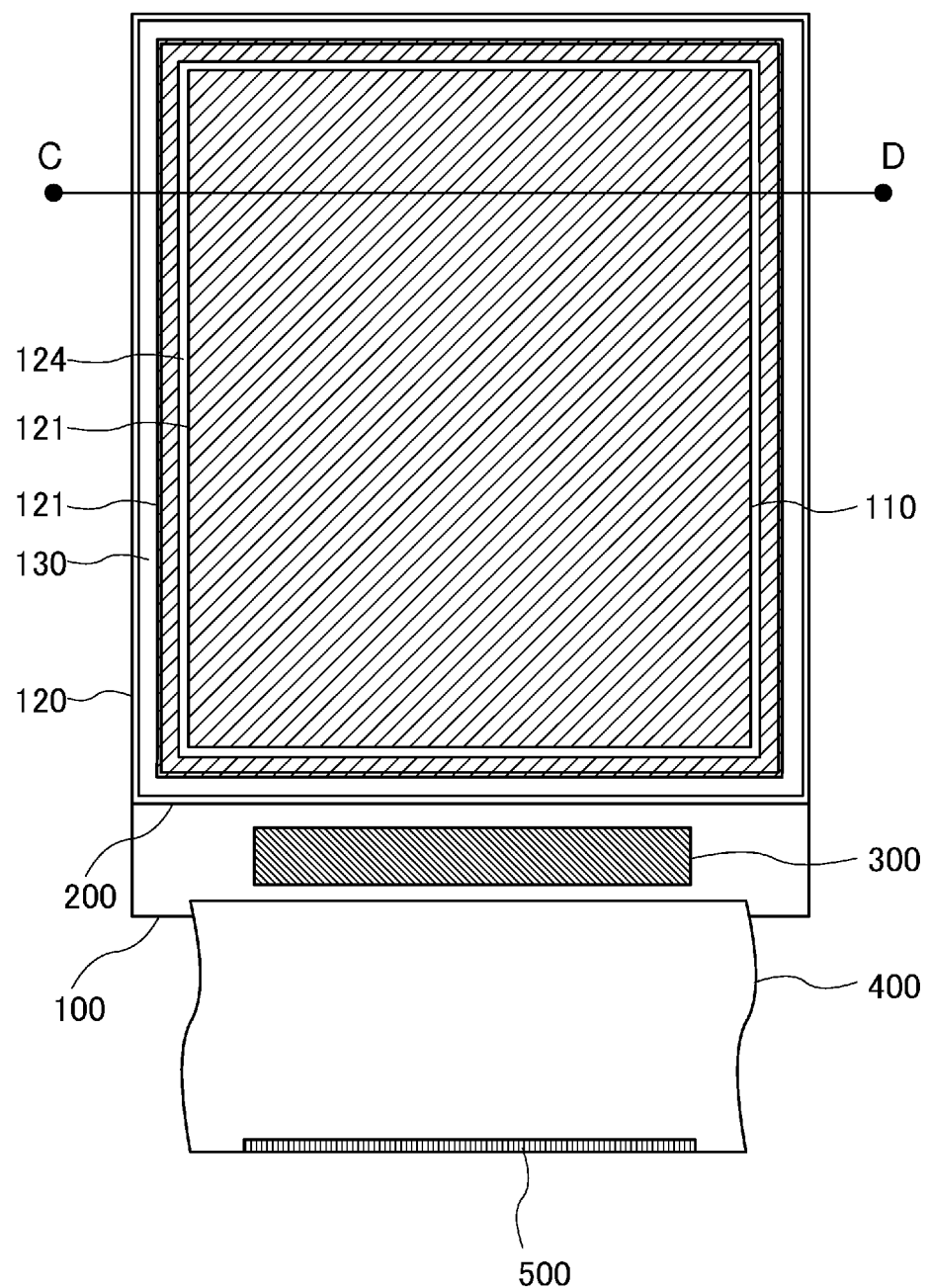
FIG. 5 is a diagram showing a planar view of a display device in embodiment two of the present invention.
Figure 6:
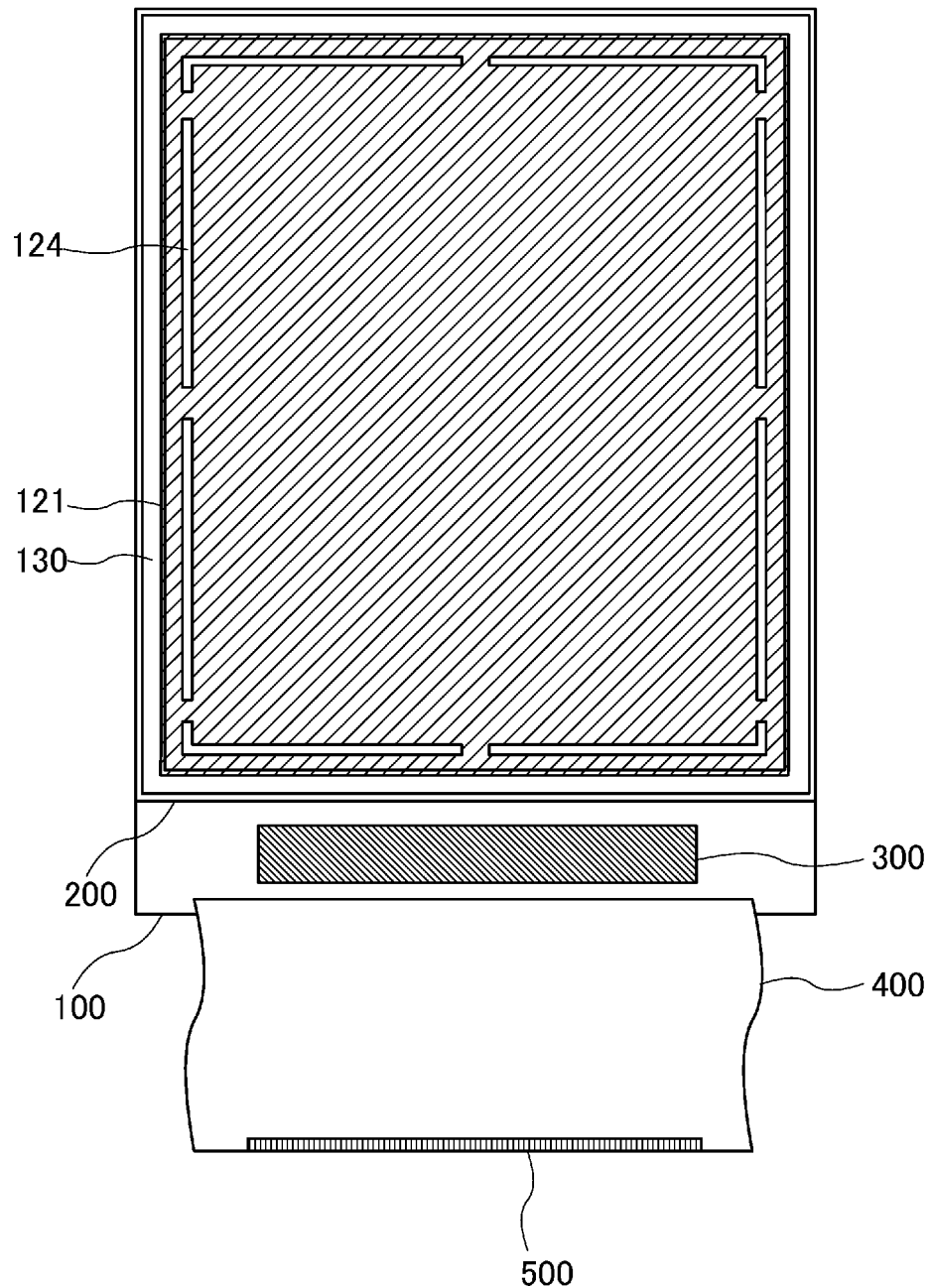
FIG. 6 is a diagram showing a planar view of a display device in a modified example one of embodiment two of the present invention.
Figure 7:
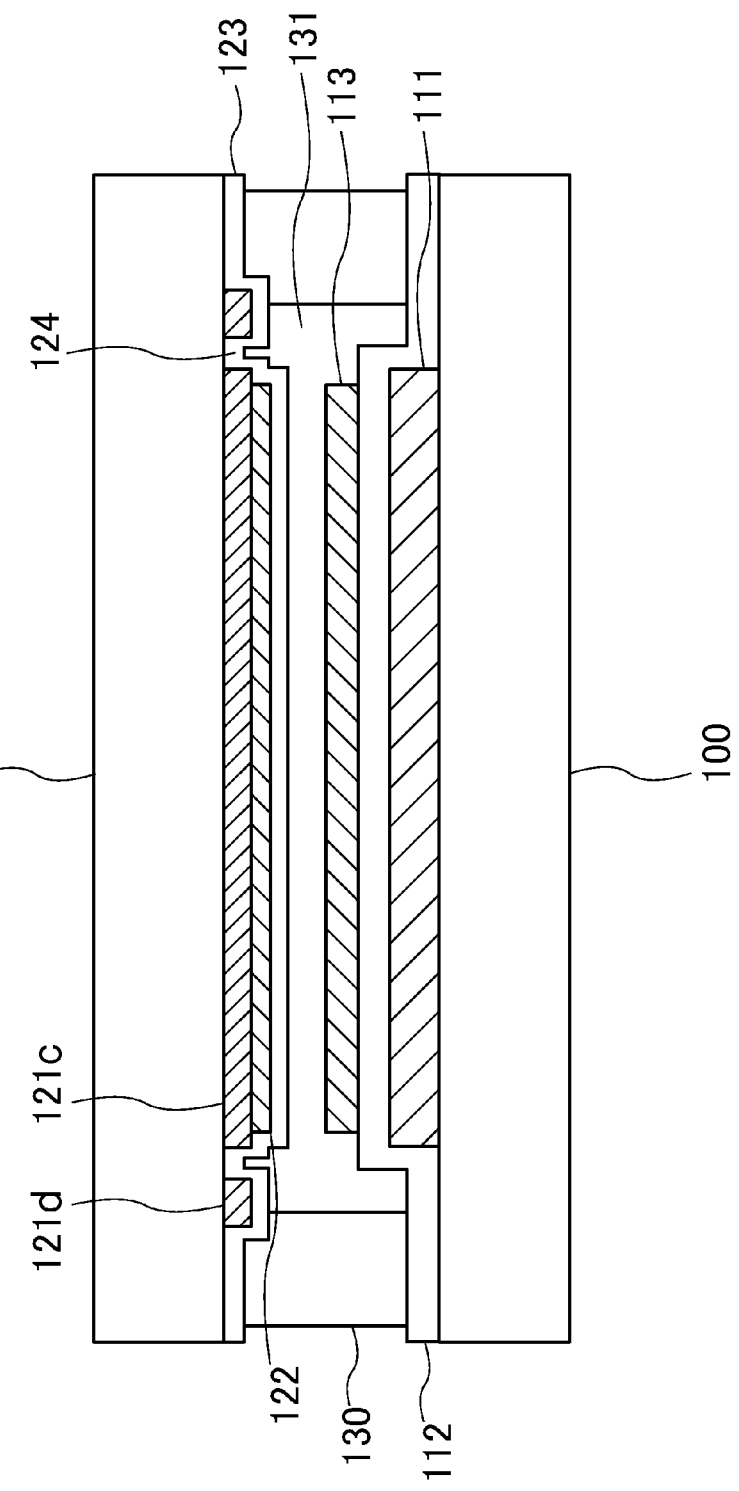
FIG. 7 is a diagram showing a cross-sectional view of the line C-D of the display device in embodiment two of the present invention.
Figure 8:
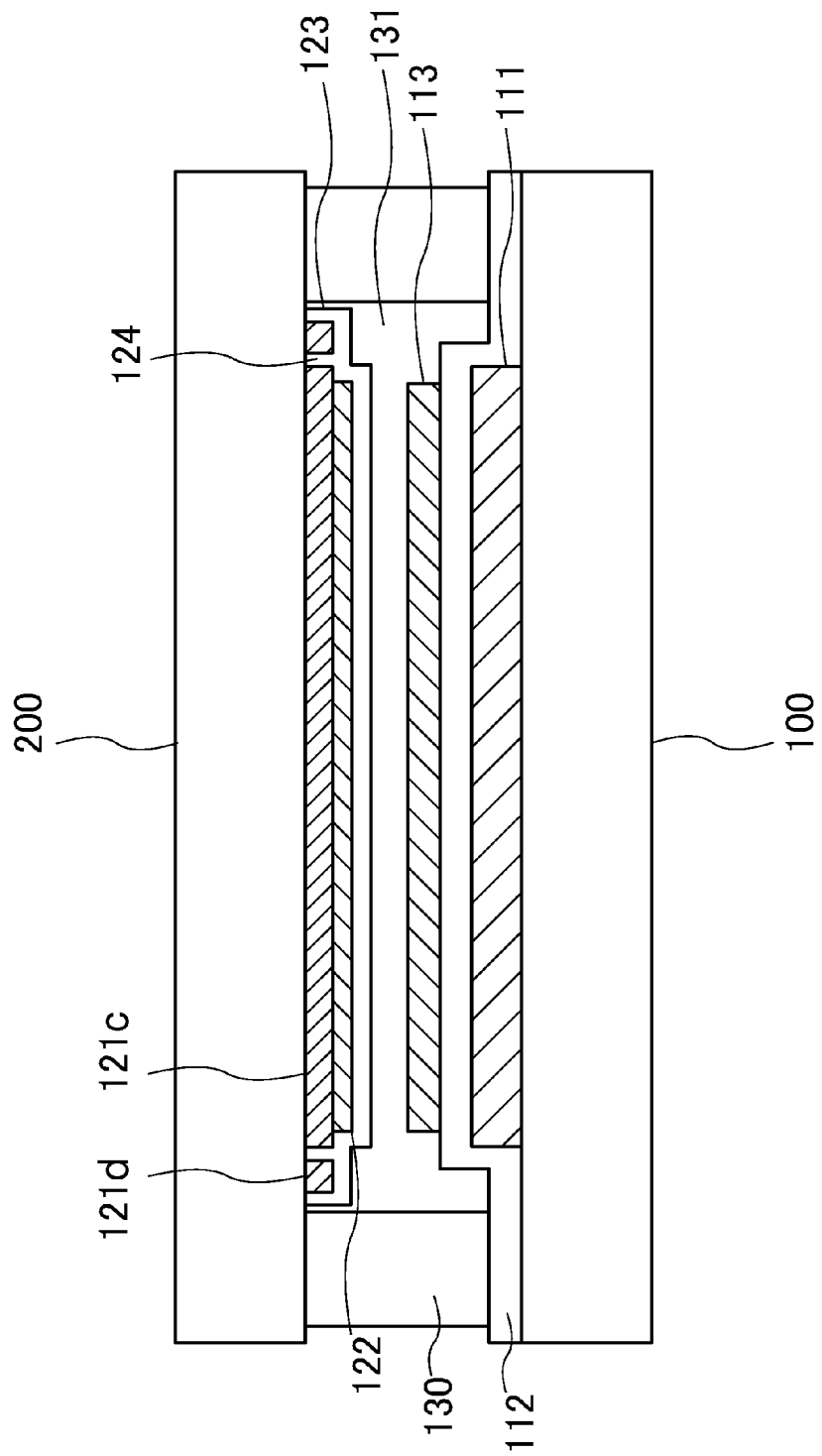
FIG. 8 is a diagram showing a planar view of a display device in a modified example two of embodiment two of the present invention.

The structure of a display device related to embodiment two of the present invention is explained using FIG. 5 to FIG. 8. FIG. 5 and FIG. 6 are diagrams showing a planar view of the display device in embodiment two and a modified example. In addition, FIG. 7 and FIG. 8 are diagrams showing a cross-sectional view of the line C-D in the display device in embodiment two and a modified example. A display device with a "white+CF structure" useful for high definition the same as embodiment one is also explained in embodiment two.

FIG. 5 is different to FIG. 2 in that the light shielding layer 121 exists up to the periphery region 120, a part of the light shielding layer 121 overlaps the glass frit 130 and a slit 124 is arranged in the periphery region of the light shielding layer 121. The slit 124 is arranged further to the exterior than the display region 110 and further to the interior of the glass frit 130. In other words, the glass frit 130 is arranged further on the exterior periphery than the slit 124. In FIG. 5, although a structure is shown in which the exterior periphery end part of the light shielding layer 121 on the exterior side of the slit 124 overlaps the glass frit 130, the present invention in not limited to this structure. An offset may also be arranged between the exterior periphery end part of the light shielding layer 121 and the glass frit 130.

In FIG. 5, a structure is shown in which the slit 124 is arranged continuously so as to enclose the display region 110, and the light shielding layer 121 is separated into a region including the display region 110 and a region including the periphery region 120. However, the present invention is not limited to the structure shown in FIG. 5, for example, the slit 124 does not have to be linked as is shown in FIG. 6. In FIG. 6, although one upper and lower unlinked section and three left and right unlinked sections of the slit 124 are shown respectively, the present invention is not limited to this structure, more or less unlinked sections are also possible.

FIG. 7 is a diagram showing a cross-sectional view of the line C-D of the display device in embodiment two of the present invention. Here, in FIG. 7, the surface of the substrate 100 faces the direction of the opposing substrate 200, and the surface of the opposing substrate 200 faces the direction of the substrate 100. In the following explanation, when explaining the structure in which the substrate 100 and opposing substrate 200 are respectively arranged, the surface direction of each substrate is expressed as facing upwards.

In FIG. 7, the slit 124 is arranged between a light shielding layer 121c which corresponds to a region including the display region 110 and a light shield layer 121d which corresponds to a region including the periphery region 120. In FIG. 7, although a structure in which a part of the light shielding layer 121d on the exterior side of the slit 124 and one part of the glass frit 130 overlap in a vertical direction, the present invention is not limited to this structure. An offset may also be arranged between the light shielding layer 121d and glass frit 130 in the direction of the surface of the substrate. In FIG. 8, although the inorganic passivation layer 123 is formed with a pattern including an end part further to the interior than the glass frit 130 and the glass frit 130 and opposing substrate 200 contact, the present invention is not limited to this structure. The inorganic passivation layer 123 may extend as far as the exterior periphery part of the opposing substrate 200 and the glass frit 130 and inorganic passivation layer 123 may contact each other.

The glass frit 130 is fused by irradiating with a laser after bonding the substrate 100 and opposing substrate 200 via the glass frit 130 in order to obtain good sealing properties. Although the laser irradiation is irradiates on a position corresponding to a glass frit, in a display device with a narrow frame, a part of the laser is sometimes irradiates on the light emitting element 113 of the display region 110. When a laser is irradiates on the light emitting element 113, there is a possibility that the film quality of a light emitting layer changes or damage is caused due to overheating of the light emitting element 113. Here, this problem can be suppressed by adopting the structure shown in FIG. 7 and FIG. 8.

A described above, with the progression of a narrow frame in a display device, the distance between the display region 110 and a region in which the glass frit 130 is arranged becomes shorter. When this distance becomes shorter, when a laser is irradiated in order to fuse the glass frit 130, a part of the laser is irradiated on the light emitting element 113 within the display region 110. However, according to the display device of embodiment two, by providing the light shielding layer 121*d* up to the periphery region 120 where the glass frit 130 is arranged, it is possible to suppress the light of the laser from being directly irradiated onto the light emitting element 113 within the display region. In addition, by arranging the slit 124 between the light emitting layer 121*c* and light emitting layer 121*d*, even if the light of the laser is irradiated on the exterior side light emitting layer 121*d* which heats the light emitting layer 121*d*, it is difficult for that heat to be transferred to the interior side light emitting layer 121*c*. As a result, it is possible to suppress overheating of the light emitting element 113 which exists in the display region 110.

As described above, according to the display device in embodiment two of the present invention, when a glass frit is locally heated using laser irradiation in a display device with both substrates bonded together using the glass frit, it is possible to suppress the laser from being irradiated on a light emitting element within a display region. In addition, by suppressing heat generated by a laser from being transmitted to the interior of the display region it is possible to suppress degradation due to overheating of the light emitting element.

Embodiment Three

Figure 9:
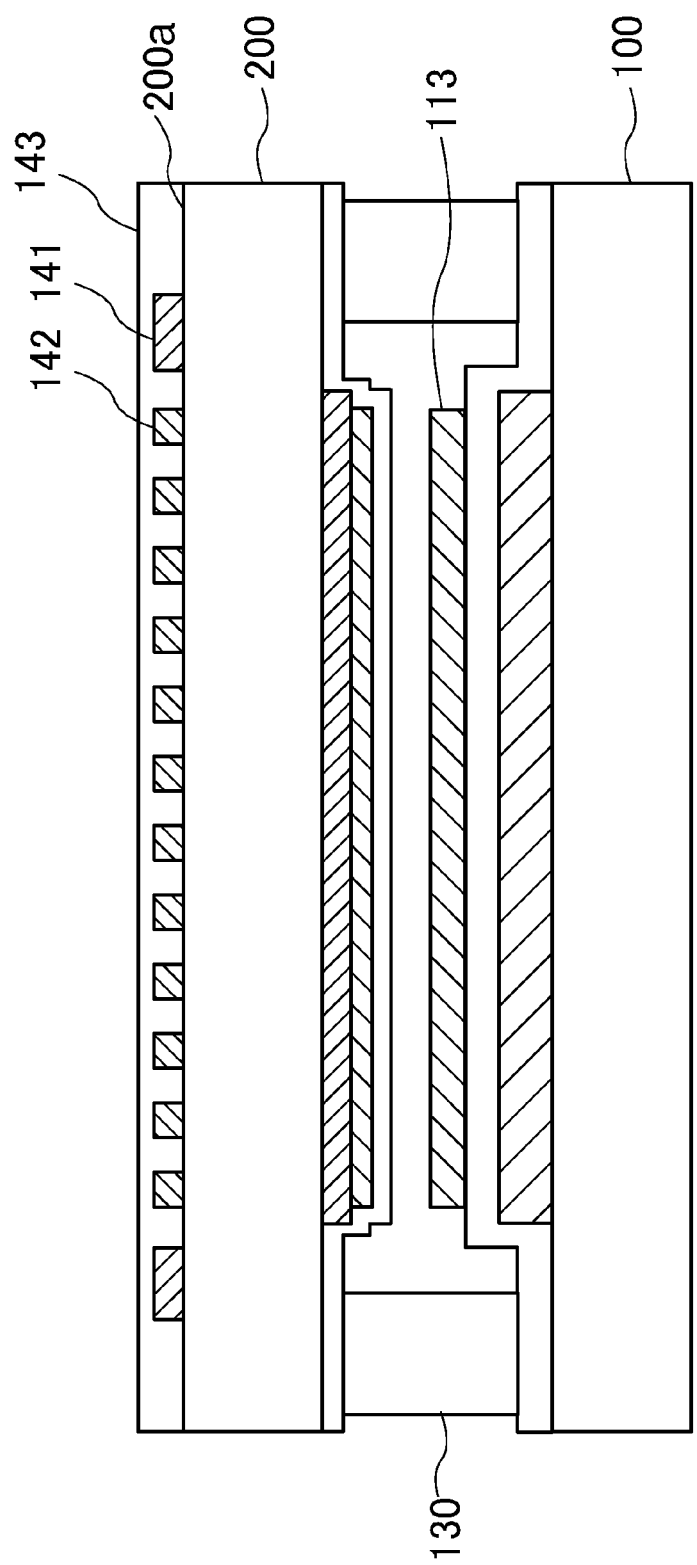
FIG. 9 is a diagram showing a cross-sectional view of a display device in embodiment three of the present invention.

A structure of the display device related to embodiment three of the present invention is explained using FIG. 9. FIG. 9 is a diagram showing a cross-sectional view of the display device in embodiment three of the present invention. The different point between FIG. 9 and FIG. 3 is that in FIG. 9, a second light shielding layer 141 and a transparent electrode 142 are arranged on an opposite surface 200*a* to the substrate 100 of the opposing substrate 200. The second light shielding layer 141 is arranged in one part of the periphery region 120 and the transparent electrode 142 is arranged in the display region 110. As is shown in FIG. 9, the transparent electrode 142 may be arranged in a stripe shape and may form wiring of a touch sensor. As is shown in FIG. 9, the second light shielding layer 141 and transparent electrode 142 may also be covered by a protection layer 143. In addition, the second light shielding layer 141 may be formed using a conductive material and used as part of wiring of a touch sensor. By using wiring for a touch sensor as a light shielding layer, it is possible to expect heat dissipation effects with respect to a rise in temperature which is a problem during laser irradiation.

The second light shielding layer 141 may also be arranged continuously so as enclose the display region 110. In addition, the light shielding layer 141 may be arranged in the periphery region 120, a part as seen in planar view may overlap the glass frit 130 as shown in FIG. 9 and reversely an offset may be arranged as seen in a planar view between the second light shielding view 141 and glass frit 130. In the case where a part of the second light shielding layer 141 overlaps the glass frit 130 as seen in a planar view, the second light shielding layer 141 is not arranged in a region which is irradiated with a laser in order to fuse the glass frit 130.

According to the structure in FIG. 9, by arranged the second light shielding layer 141 in the periphery region 120, it is possible to suppress laser light from being directly irradiated on the light emitting element 112 within the display region. In addition, even in the case where the second light shielding layer 141 overheats due the laser light irradiation, because the distance between the light emitting element 113 and second light shielding layer 141 is separated, it is possible to reduce the effects of heat generated in the second light layer 141 from being applied to the light emitting element 113 and transistor layer 111.

As described above, according to the display device in embodiment three of the present invention, when a glass frit is locally heated using laser irradiation in a display device with both substrates bonded together using the glass frit, it is possible to suppress the laser from being irradiated on a light emitting element within a display region. In addition, by suppressing heat generated by a laser from being transmitted to the interior of the display region it is possible to suppress degradation due to overheating of the light emitting element.

Embodiment Four

Figure 10:
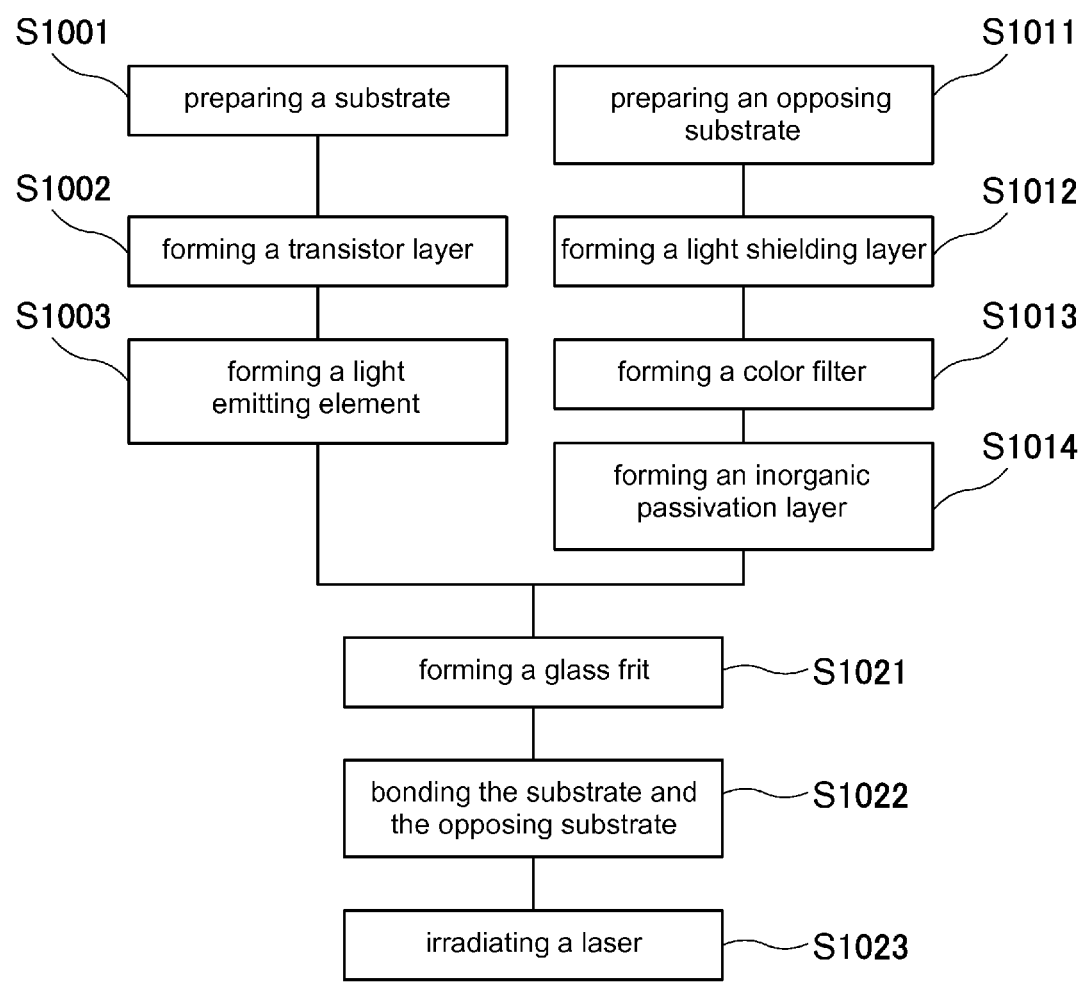
FIG. 10 is a diagram showing a process flow of a manufacturing method of a display device in embodiment four of the present invention.
Figure 11:
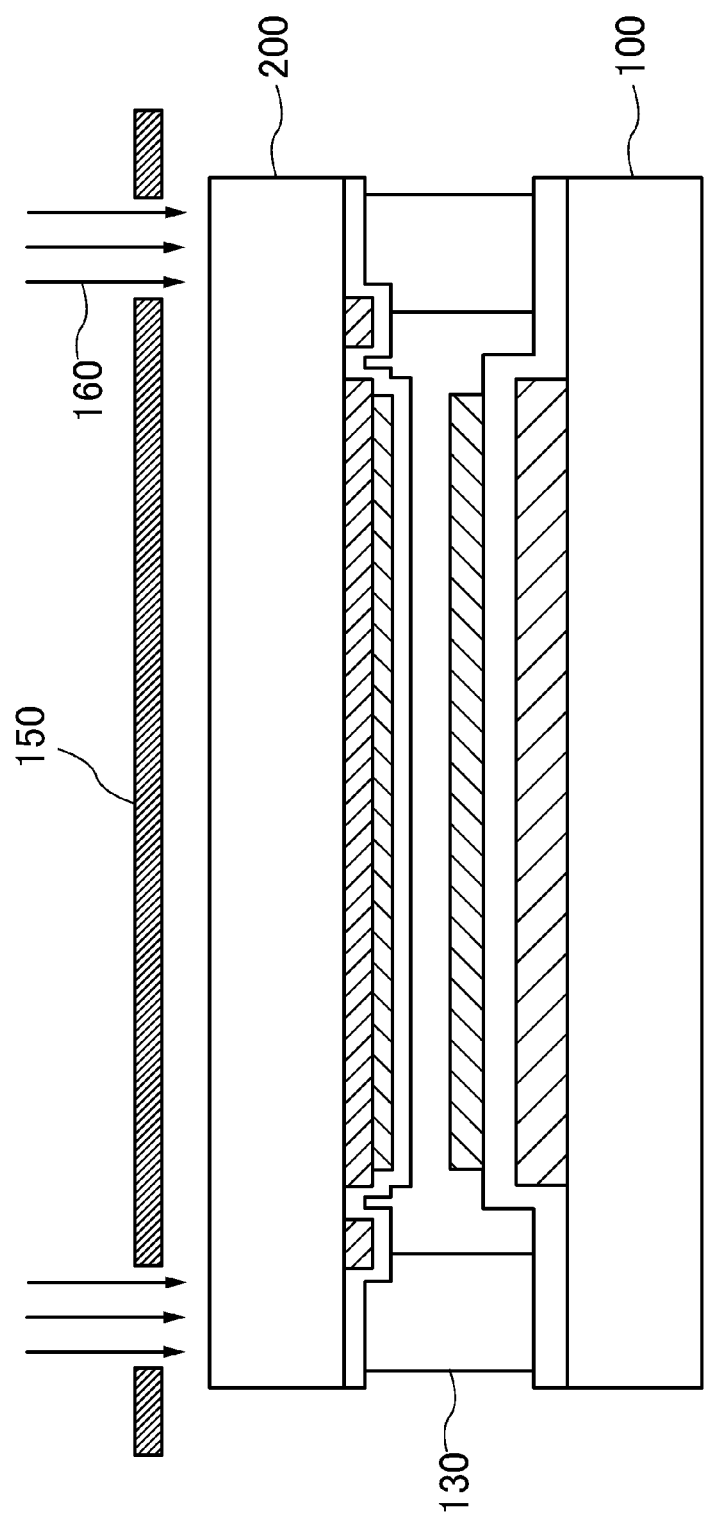
FIG. 11 is a diagram showing a laser irradiation method on a glass frit of a display device in embodiment four of the present invention.
Figure 12:
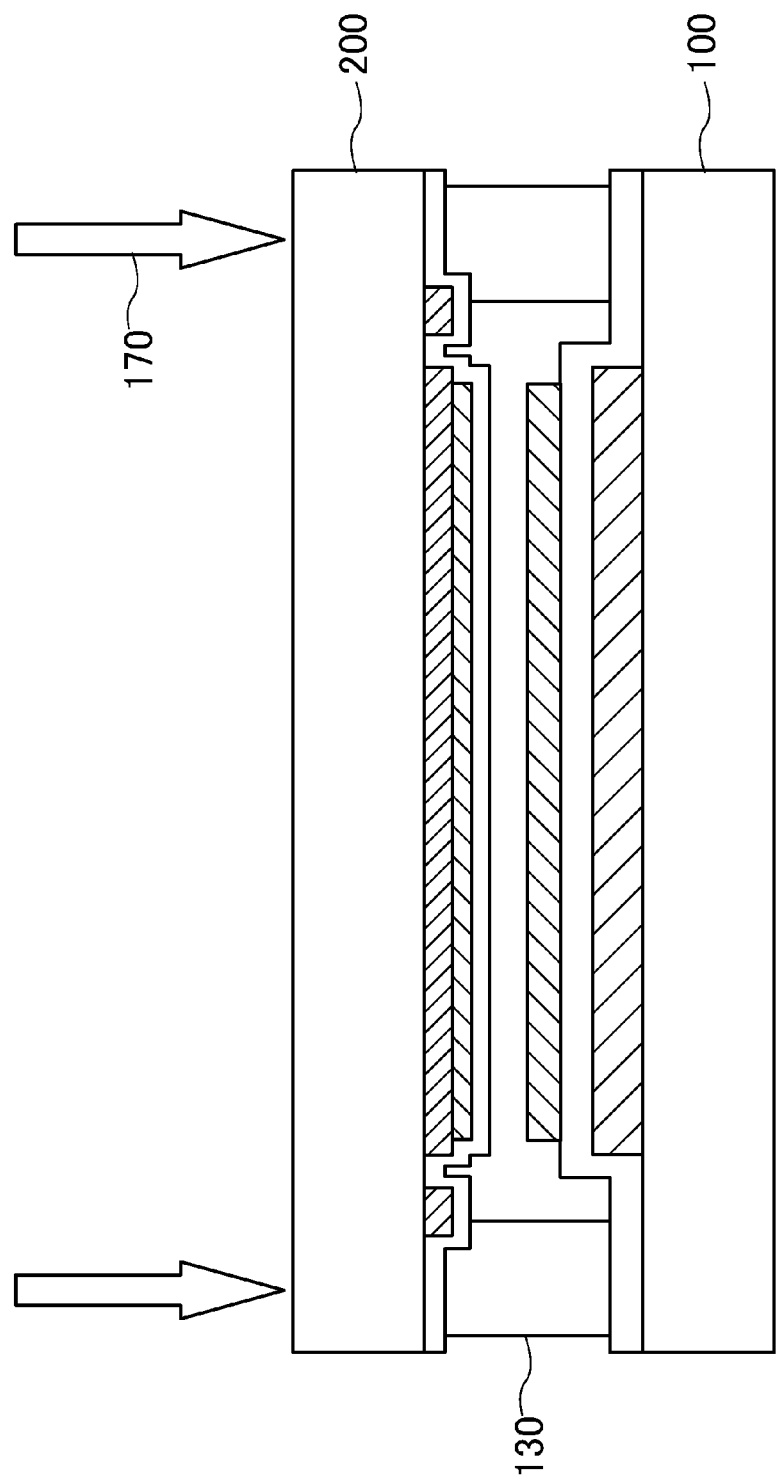
FIG. 12 is a diagram showing a laser irradiation method on a glass frit of a display device a modified example of embodiment four of the present invention.

A manufacturing method of a display device related to embodiment four of the present invention is explained using FIG. 10 to FIG. 12. FIG. 10 is a diagram showing a process flow of a manufacturing method of the display device in embodiment four of the present invention. A manufacturing method of the display device in the present invention is explained using FIG. 10.

First, a substrate such as a glass substrate is prepared (S1001) and a transistor layer is formed above the substrate (S1002). It is possible to use a general transistor as the transistor layer, for example, a bottom gate type transistor or top gate type transistor using amorphous silicon, polysilicon or oxide semiconductor etc. Before forming the transistor layer, a single or stacked ground layer which blocks impurities from the glass substrate may be formed in order to improve adhesion. Next, after forming the transistor layer, a single or stacked interlayer insulation layer is formed, and a light emitting element is formed in a display region arranged with a plurality of pixels (S1003). The light emitting element is obtained by forming a bottom electrode connected to a transistor layer via a contact formed in the interlayer insulation layer, a light emitting layer is formed above the bottom electrode, and a common electrode common to a plurality of light emitting elements is formed above the light emitting layer.

Next, an opposing substrate such as a glass substrate is prepared (S1011) and a light shielding layer which exposes a pixel is formed above the opposing substrate (S1012). A metal such as Cr or a resin material pigmented in black may be used as the light shielding layer. The light shielding layer is formed in the display region and the periphery region. The light shielding layer is formed in a region which defines each pixel in the display region so as to overlap wiring etc, and formed in a region between the display region and glass frit in the periphery region.

Next, a color filter including a pigment layer is formed in an aperture part arranged in the light shielding layer of the opposing substrate (S1013). The color filter is formed in the display region and is formed in a region corresponding to each light emitting element. At least a R (red), G (green) and B (blue) color filter are formed for realizing full color. In addition, a white color filter may be formed for improving color reproduction in a white color pixel arranged for improving luminosity.

Although a manufacturing method for forming a color filter above a light shielding layer was explained in FIG. 10, the present invention is not limited to this structure. The color filter may be formed first and then the light shielding layer may be formed above the color filter. In addition, another layer may be formed between the opposing substrate and light shielding layer or color filter, or another layer may be formed between the light shielding layer and the color filter. In addition, although at least three types of color filter RGB are formed as the color filter, a light shielding layer may be formed between any of the three types of color filter. For example, first the G color filter may be formed above the opposing substrate, the light shielding layer may be formed above the G color filter then the R B color filters may be formed above these.

After forming the light shielding layer and color filter, an inorganic passivation layer is formed so as to cover the upper surface and end parts above the light shielding layer and color filter (S1014). Because the inorganic passivation layer covers an organic film which discharges any gas or water which leads to degradation of a light emitting element, the inorganic passivation layer may be formed at least so that the color filter is not exposed in the space part 131. In the case where the light shielding layer is formed from a resin, the inorganic passivation layer is formed so that both the color filter and light shielding layer are not exposed in the space part 131. That is, as is shown in FIG. 3, the light shielding layer 121 includes an upper surface 121*a* facing the substrate 100 and end part 121*b*, the color filter 122 includes an upper surface 122*a* facing the substrate 100 and an end part 122*b*, and the inorganic passivation layer 123 is arranged so as to cover 121*a*, 122*a*, 121*b* and 122*b*

Next, the glass frit is formed above either or both the substrate formed up to the light emitting element and the opposing substrate formed up to the inorganic passivation layer (S1021). A paste shaped glass frit is coated on the periphery part of the substrate or the opposing substrate and after sufficient removal of a solution or binder within the paste using a thermal process using a furnace etc, both substrates are bonded together so that the display region and color filter face each other (S1022).

Here, it is very important that the atmosphere when bonding be filled into the space part sealed by the substrate, opposing substrate and glass frit. In embodiment four, binding of the two substrates is performed under an atmosphere of $N_2$. However, the present invention in not limited this. The atmosphere in the process for bonding both substrates may be an atmosphere so that the contained amount of water or oxygen which leads to degradation of a light emitting element is small. For example, the atmosphere for bonding both substrates is preferred to have a dew point temperature of −70° C. or less and more preferably −90° C. or less. In addition, the atmosphere for forming both substrates is preferred to have an oxygen concentration of 1 ppm or less and more preferably 0.5 ppm or less. In addition, the atmosphere for bonding both substrates may be under a reduced pressure or reversely under added pressure. In either case, the atmosphere when bonding both substrates is preferred to have a small contained amount of water or oxygen.

In addition, the interior may be in a vacuum state so as to secure a gap between the substrates when forming a spacer between both substrates.

Finally, the glass frit formed on the bonded substrates is heated locally using laser irradiation (S1023). By locally heating the glass frit, the glass frit is fused to a pair of substrates or an inorganic layer formed above a pair of substrates and the light emitting element is sealed. Here, the glass frit may include a pigment which absorbs the energy of the laser light wavelength band in order to effectively absorb the laser light and emit heat.

Next, a more specific method of the laser irradiation process is explained using FIG. 11 and FIG. 12. FIG. 11 is a diagram showing a laser irradiation method of a glass frit of a display device in embodiment four of the present invention. In FIG. 11, a mask 150 including an aperture part corresponding to a region in which the glass frit is formed is arranged on a rear surface side (opposite surface to the substrate 100) of the opposing substrate 200, and a laser 160 is irradiated on the substrate 100, opposing substrate 200 and glass frit 130 via the mask 150. Here, the aperture part of the mask 150 may also be arranged so that the laser 160 is irradiated on the entire glass frit 130, or arranged so that the laser 160 is irradiated on a part of the glass frit 130.

By using a wavelength band of the laser 160 whereby the laser is not absorbed by the substrate 100 and opposing substrate 200, it is possible to efficiently heat the glass frit. That is, by suppressing heat being generated in the substrate 100 and opposing substrate 200, it is possible to reduce the effects on a light emitting element. In addition, by using a mask, it is possible to use not only as laser but also a heating method using light with a lower directionality compared to a laser such as a halogen lamp or xenon lamp for example. In addition, even when a laser in used, because alignment with a high degree of precision is no longer necessary, it is possible to obtain the effects such as device simplification, improvement in productivity and reduce defects due to errors in irradiation.

As is shown in FIG. 12, it is possible to heat only the region in which the glass frit 130 is arranged by using a laser 170 with high directionality. For example, by reflecting the laser 170 emitted from a light source using a mirror (for example Galvanometer mirror) etc, it is possible to scan a region in which the glass frit is arranged. According to the method shown in FIG. 12, it is possible to perform laser irradiation using the same device just by changing the program which scans the laser even on a panel including the glass frit arranged in different shapes. That is, by changing a program, it is possible to irradiate a laser on any type of panel and improve versatility of a device.

As described above, according to the manufacturing method of the display device in embodiment four of the present invention, it is possible to arrange a color filter or light shielding layer between substrates, and suppress the phenomenon whereby a light emitting element degrades due degassing or a water component from an organic material such as a color filter or light shielding layer (in the case of a resin light shielding layer) in a display device in which a pair of substrates are bonded using a glass frit.

Furthermore, the present invention is not limited to the embodiments described above and can be appropriately modified without departing from the scope of the invention.

What is claimed is:

1. A display device comprising:
   a first substrate comprising a display region arranged with
      a plurality of pixels having a light emitting element;

a second substrate comprising a light shielding layer having an aperture part corresponding to the pixel and a color filter being arranged in at least the aperture part and including a pigment layer;

a seal component comprising glass, the seal component bonding the first substrate and second substrate so that the display region and color filter faces each other, and being arranged on the exterior side of the color filter; and an inorganic insulation layer covering at least an upper surface and end part of the color filter, wherein the inorganic insulation layer is in contact with the seal component, the inorganic insulation layer is provided between the second substrate and the seal component, the inorganic insulation layer has a first surface and a second surface opposite side of the first surface, the seal component is in contact with the inorganic insulation layer at the first surface, the second substrate is in contact with the inorganic insulation layer at the second surface, and the seal component overlaps with the second substrate in a planar view.

2. The display device according to claim 1, wherein the light emitting element is exposed in a space part enclosed by the first substrate, the second substrate and seal component.

3. The display device according to claim 2, wherein a gas with a dew point of −70° C. or less is included in the space part.

4. The display device according to claim 3, wherein the gas with an oxygen concentration of 1 ppm or less is included in the space part.

5. A display device comprising:
a first substrate comprising a display region arranged with a plurality of pixels having a light emitting element;
a second substrate facing the first substrate, the second substrate being transparent;
a light shielding layer between the first substrate and the second substrate, wherein the light shielding layer has both an aperture part and a slit, the aperture part corresponding to the pixel, and the slit being in a periphery region located in a periphery of the display region; and
a seal component comprising glass, the seal component bonding the first substrate and the second substrate so that the display region and the aperture part face each other.

6. The display device according to claim 5, wherein the slit is continuously arranged so as to enclose the display region.

7. The display device according to claim 6, wherein the second substrate includes a color filter having a pigment layer and arranged in at least an aperture part of the light shielding layer; and an inorganic insulation layer covering at least an upper surface and end part of the color filter.

8. The display device according to claim 7, wherein the light emitting element is exposed in a space part enclosed by the first substrate, the second substrate and the seal component.

9. The display device according to claim 8, wherein the seal component contacts the inorganic insulation layer.

10. The display device according to claim 8, wherein a gas with a dew point of −70° C. or less is included in the space part.

11. The display device according to claim 10, wherein the gas with an oxygen concentration of 1 ppm or less is included in the space part.

12. A display device comprising:
a first substrate comprising a display region arranged with a plurality of pixels having a light emitting element;
a second substrate facing the first substrate, the second substrate being transparent;
a first light shielding layer between the first substrate and the second substrate, the first light shielding layer having an aperture part corresponding to the pixel;
a second light shielding layer on an opposite side of the first light shielding layer with respect to the second substrate, the second light shielding layer being arranged in a periphery region located in a periphery of the display region; and
a seal component comprising glass, the seal component bonding the first substrate and second substrate so that the display region and color filter faces each other.

13. The display device according to claim 12, wherein the second light shielding layer is continuously arranged so as to enclose the display region.

14. The display device according to claim 12, further comprising:
a transparent conductive layer arranged in the display region in a surface arranged with the second light shielding layer.

15. The display device according to claim 14, wherein the transparent conductive layer is a wiring of a touch sensor.

16. The display device according to claim 5, wherein the slit is arranged in an area sandwiched between the light emitting element and the seal component in a planar view.

17. The display device according to claim 1, wherein the second substrate is transparent.

18. The display device according to claim 1, wherein
the seal component, the inorganic insulation layer and the second substrate are overlapped each other in a planar view, and
the inorganic insulation layer is provided between the seal component and the second substrate.

19. The display device according to claim 5, wherein the second substrate does not have any hole in an area where the second substrate overlaps with the seal component in a planar view.

20. The display device according to claim 12, wherein the second substrate does not have any hole in an area where the second substrate overlaps with the seal component in a planar view.

* * * * *